United States Patent
Lu et al.

(10) Patent No.: US 12,354,921 B2
(45) Date of Patent: Jul. 8, 2025

(54) WAFER STRUCTURE INCLUDING PROBE MARKED TEST PADS

(71) Applicant: Powerchip Semiconductor Manufacturing Corporation, Hsinchu (TW)

(72) Inventors: Chun-Lin Lu, Hsinchu (TW); Shou-Zen Chang, Hsinchu (TW); Ying-Tsung Chu, Hsinchu (TW); Ming-Hsun Tsai, Hsinchu (TW)

(73) Assignee: Powerchip Semiconductor Manufacturing Corporation, Hinschu (TW)

( * ) Notice: Subject to any disclaimer, the term of this patent is extended or adjusted under 35 U.S.C. 154(b) by 489 days.

(21) Appl. No.: 17/709,448

(22) Filed: Mar. 31, 2022

(65) Prior Publication Data
US 2023/0034412 A1 Feb. 2, 2023

(30) Foreign Application Priority Data

Jul. 30, 2021 (TW) .................................. 110128096
Feb. 17, 2022 (TW) .................................. 111105763

(51) Int. Cl.
*H01L 23/52* (2006.01)
*H01L 21/66* (2006.01)
(Continued)

(52) U.S. Cl.
CPC .......... *H01L 22/32* (2013.01); *H01L 23/5226* (2013.01); *H01L 23/5283* (2013.01);
(Continued)

(58) Field of Classification Search
CPC . H01L 22/32; H01L 23/5226; H01L 23/5283; H01L 23/481; H01L 24/05;
(Continued)

(56) References Cited

U.S. PATENT DOCUMENTS 12,176,320 B2 * 12/2024 Chen ........................ H01L 24/09
12,205,856 B2 * 1/2025 Chen ........................ H01L 22/20
(Continued)

FOREIGN PATENT DOCUMENTS

DE 102015114902 A1 * 2/2017 ............. H01L 24/08
TW 202101720 1/2021

OTHER PUBLICATIONS

"Office Action of Taiwan Counterpart Application, Application No. 111105763", issued on Jan. 11, 2023, p. 1-p. 5.

*Primary Examiner* — Ida M Soward
(74) *Attorney, Agent, or Firm* — JCIPRNET

(57) ABSTRACT

A wafer structure and a manufacturing method thereof are provided. The wafer structure includes a substrate structure, a first dielectric layer, multiple test pads, a second dielectric layer, and multiple bond pads. The first dielectric layer is disposed on the substrate structure. The test pads are disposed in and exposed outside the first dielectric layer. Each test pad has a probe mark. The second dielectric layer is disposed on the first dielectric layer. The second dielectric layer has a top surface away from the test pads. Multiple bond pads are disposed in and exposed outside the second dielectric layer. Each bond pad is electrically connected to the corresponding test pad. The bond pads have bonding surfaces away from the test pads. The bonding surfaces are flush with the top surface. In the normal direction of the substrate structure, each bond pad does not overlap the probe mark of the corresponding test pad.

6 Claims, 14 Drawing Sheets

(51) Int. Cl.
  *H01L 23/00* (2006.01)
  *H01L 23/522* (2006.01)
  *H01L 23/528* (2006.01)
  *G01R 1/04* (2006.01)
  *H01L 21/768* (2006.01)

(52) U.S. Cl.
  CPC ............ *H01L 24/05* (2013.01); *G01R 1/0491* (2013.01); *H01L 21/76816* (2013.01); *H01L 24/08* (2013.01); *H01L 2224/05554* (2013.01); *H01L 2224/05569* (2013.01); *H01L 2224/0557* (2013.01); *H01L 2224/08147* (2013.01); *H01L 2924/30101* (2013.01)

(58) Field of Classification Search
  CPC ............... H01L 24/32; H01L 24/08; H01L 2224/05554; H01L 2224/05569; H01L 2224/0557; H01L 2224/08147; H01L 2924/30101; G01R 1/0491
  See application file for complete search history.

(56) References Cited

U.S. PATENT DOCUMENTS

| | | | |
|---|---|---|---|
| 2009/0243118 A1* | 10/2009 | Akiba | H01L 22/14 257/773 |
| 2011/0156032 A1* | 6/2011 | Zhang | H01L 22/20 257/E21.59 |
| 2015/0200158 A1* | 7/2015 | Okumura | H01L 21/02271 438/612 |
| 2016/0141216 A1 | 5/2016 | Pagani | |
| 2017/0229359 A1 | 8/2017 | Akiba et al. | |
| 2019/0131277 A1* | 5/2019 | Yang | H01L 24/05 |
| 2020/0381379 A1* | 12/2020 | Chen | H01L 24/05 |
| 2020/0395254 A1* | 12/2020 | Chen | H01L 25/0657 |
| 2022/0028748 A1* | 1/2022 | Liu | H01L 22/32 |
| 2022/0262698 A1* | 8/2022 | Chen | H01L 23/49822 |
| 2022/0293560 A1* | 9/2022 | Chen | H01L 21/6835 |
| 2022/0359456 A1* | 11/2022 | Chen | H01L 24/08 |
| 2025/0140627 A1* | 5/2025 | Chen | H01L 23/49816 |

* cited by examiner

WAFER STRUCTURE INCLUDING PROBE MARKED TEST PADS

CROSS-REFERENCE TO RELATED APPLICATION

This application claims the priority benefit of Taiwan application serial no. 110128096, filed on Jul. 30, 2021 and Taiwan application serial no. 111105763, filed on Feb. 17, 2022. The entirety of each of the above-mentioned patent applications is hereby incorporated by reference herein and made a part of this specification.

BACKGROUND

Technology Field

The disclosure relates to a wafer structure, and particularly, to a wafer structure and a manufacturing method thereof which contribute to favorable bonding quality during wafer bonding or a lower resistance value where wafers bond.

Description of Related Art

Before hybrid bonding of multiple wafers, electrical tests such as chip probing test (CP test) or wafer acceptance test (WAT test) may be performed on the bond pads of each wafer with probes, and thereby the electrical quality of each die in the wafer is detected. However, when performing a die inspection or a wafer acceptance test, the probes may result in probe marks of the bond pads. Therefore, after hybrid bonding of multiple wafers with bond pads in the subsequent process, bubbles are likely to be generated between the two corresponding bond pads, resulting in a decrease in bonding quality and an increase in the resistance of the bonding, which in turn affects the overall electrical quality and electrical reliability.

SUMMARY

The disclosure provides a wafer structure and a manufacturing method thereof, which contribute to favorable bonding quality during wafer bonding or a lower resistance value at the place where wafers bond.

The wafer structure of the disclosure includes a substrate structure, a first dielectric layer, multiple test pads, a second dielectric layer, and multiple bond pads. The first dielectric layer is disposed on the substrate structure. The test pads are disposed in the first dielectric layer and exposed outside the first dielectric layer. Each of the test pads has a probe mark. The second dielectric layer is disposed on the first dielectric layer and has a top surface away from the test pads. The bond pads are disposed in the second dielectric layer and exposed outside the second dielectric layer. Each of the bond pads is electrically connected to a corresponding test pad. The bond pads have bonding surfaces away from the test pads. The bonding surfaces are flush with the top surface. In a normal direction of the substrate structure, each of the bond pads is not overlapped with the corresponding probe mark of the test pad.

In an embodiment of the disclosure, the test pads are electrically connected to the substrate structure, and the test pads are not electrically connected to one another.

In an embodiment of the disclosure, the second dielectric layer is further disposed in the probe mark.

In an embodiment of the disclosure, the wafer structure further includes a third dielectric layer and multiple first conductive holes. The third dielectric layer is disposed between the first dielectric layer and the second dielectric layer. The first conductive holes penetrate through the third dielectric layer and are electrically connected to each of the bond pads and the corresponding test pads, respectively.

In an embodiment of the disclosure, the above-mentioned third dielectric layer is further disposed in the probe mark.

In an embodiment of the disclosure, the wafer structure further includes a redistribution layer. The redistribution layer is disposed between the second dielectric layer and the third dielectric layer. The redistribution layer includes at least one circuit layer, at least one fourth dielectric layer, and multiple second conductive holes. The circuit layer is disposed on the third dielectric layer and includes multiple first pads. The fourth dielectric layer is disposed on the circuit layer. The second conductive holes penetrate through the fourth dielectric layer and are electrically connected to the corresponding bond pads and the corresponding first pads, respectively. Each of the first pads is overlapped with the corresponding test pad in the normal direction.

In an embodiment of the disclosure, the circuit layer further includes multiple second pads. The second pads are physically separated from the first pads. Each of the second pads is overlapped with the corresponding probe mark of the test pad in the normal direction.

In an embodiment of the disclosure, the circuit layer further includes multiple second pads. The second pads are physically separated from the first pads. Each of the second pads is not overlapped with the corresponding probe mark of the test pad in the normal direction.

The wafer structure of the disclosure includes a substrate structure, a first dielectric layer, multiple test pads, and filling structures. The first dielectric layer is disposed on the substrate structure and has a first surface away from the substrate structure. The test pads are disposed in the first dielectric layer and exposed outside the first dielectric layer. Each of the test pads has a probe mark and a test surface away from the substrate structure. A filling structure disposed in the probe mark of each of the test pads and has an upper surface away from the substrate structure. The upper surface, the test surface, and the first surface are flush.

In an embodiment of the disclosure, the test pads are electrically connected to the substrate structure, and the test pads are not electrically connected to one another.

In an embodiment of the disclosure, there is an interface between the filling structure and each of the bond pads.

In an embodiment of the disclosure, the filling structure includes a seed layer and a metal layer. The seed layer is disposed in the probe marks, and the metal layer is disposed on the seed layer to fill the probe marks.

In an embodiment of the disclosure, the filling structure includes a second dielectric layer.

The manufacturing method of the wafer structure of the disclosure includes steps as follows. A substrate structure is provided. Multiple test pads are formed on the substrate structure. Each of the test pads has a probe mark. A first dielectric layer is formed on the substrate structure, so that the test pads are disposed in the first dielectric layer and exposed outside the first dielectric layer. Multiple bond pads are formed on the first dielectric layer so that each of the bond pads is electrically connected to a corresponding test pad. A second dielectric layer is formed on the first dielectric layer, so that the bond pads are disposed in the second dielectric layer and exposed outside the second dielectric layer. The second dielectric layer has a top surface away from the test pads. The bond pads have a bonding surface away from the test pads. The bonding surface is flush with the top surface. In a normal direction of the substrate structure, each of the bond pads is not overlapped with the corresponding probe mark of the test pad.

In an embodiment of the disclosure, the manufacturing method further include steps as follows. A third dielectric layer is formed between the first dielectric layer and the second dielectric layer. Multiple first conductive holes are formed to penetrate through the third dielectric layer, and the first conductive holes are electrically connected to each of the bond pads and the corresponding test pads, respectively.

In an embodiment of the disclosure, the manufacturing method further includes steps as follows. A redistribution layer is formed between the second dielectric layer and the third dielectric layer. The redistribution layer includes at least one circuit layer, at least one fourth dielectric layer, and multiple second conductive holes. The circuit layer is disposed on the third dielectric layer and includes multiple first pads. The fourth dielectric layer is disposed on the circuit layer. The second conductive holes penetrate through the fourth dielectric layer and are electrically connected to the corresponding bond pads and the corresponding first pads, respectively. Each of the first pads is overlapped with the corresponding test pad in the normal direction.

The manufacturing method of the wafer structure of the disclosure includes steps as follows. A substrate structure is provided. Multiple test pads are formed on the substrate structure. Each of the test pads has a probe mark. A first dielectric layer is formed on the substrate structure, so that the test pads are disposed in the first dielectric layer and exposed outside the first dielectric layer. A filling structure is formed in the probe mark of each of the bond pads. The test pads have a test surface away from the substrate structure. The first dielectric layer has a first surface away from the substrate structure. The filling structure has an upper surface away from the substrate structure. The test surface, the first surface, and the upper surface are flush.

In an embodiment of the disclosure, the step of forming the filling structure in the probe mark of each of the bond pads includes steps as follows. A second dielectric layer is formed on the first dielectric layer and the test pads. Part of the second dielectric layer is removed to expose the first dielectric layer and the test pads.

In an embodiment of the disclosure, the step of forming the filling structure in the probe mark of each of the bond pads includes steps as follows. A seed layer is formed in the probe mark. A conductive layer is formed on the seed layer to fill the probe marks.

In summary, in the wafer structure and the manufacturing method thereof according to an embodiment of the disclosure, with the configuration of additional multiple bond pads or filling structures, the bond pads with favorable flatness or test pads with favorable flatness are provided. Accordingly, the bond pads or the test pads with the filling structures can be used for hybrid bonding with another wafer structure, so as to ensure that when performing the wafer bonding, the wafer structure of the embodiment can have a favorable bonding quality, no air bubbles may be generated between the two corresponding bond pads after bonding, and there is a lower resistance value at the place where the wafers bond, thereby improving the electrical quality and electrical reliability of the wafer structure of the embodiment.

In order to make the features and advantages of the disclosure comprehensible, embodiments accompanied with drawings are described in detail below.

DESCRIPTION OF THE EMBODIMENTS

Figure 1A:
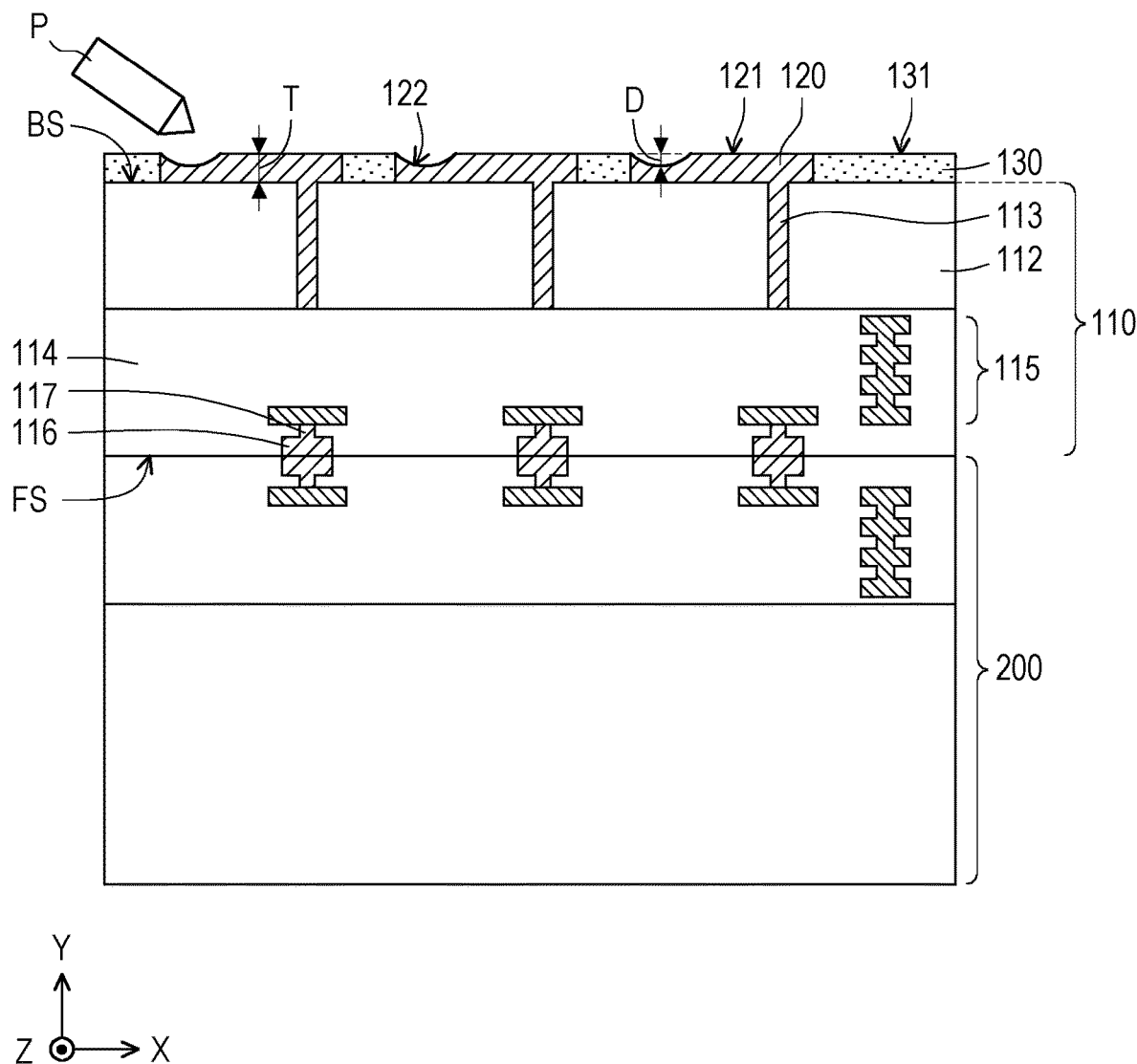
FIG. 1A to FIG. 1B are schematic cross-sectional views of a manufacturing method of a wafer structure according to an embodiment of the disclosure.
Figure 1B:
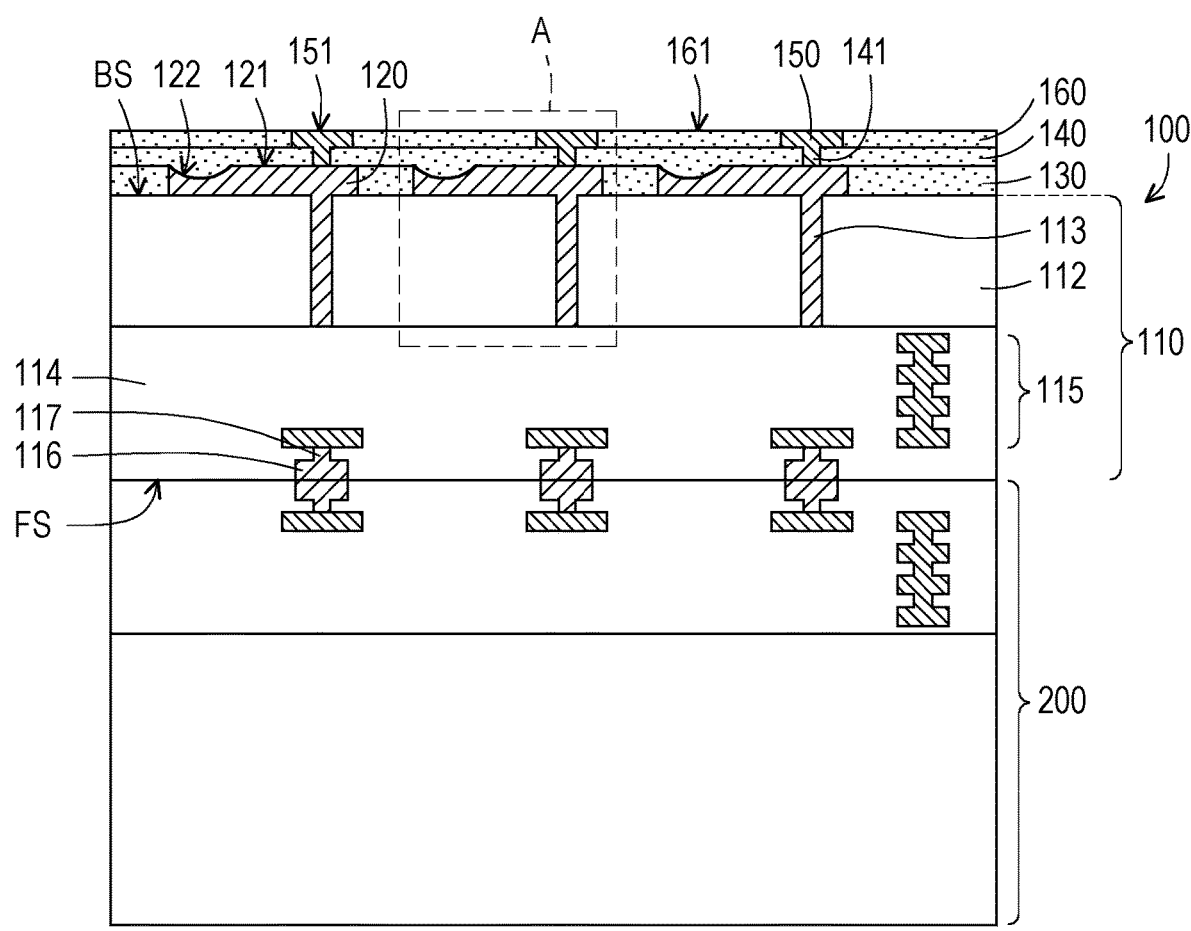
Figure 1C:
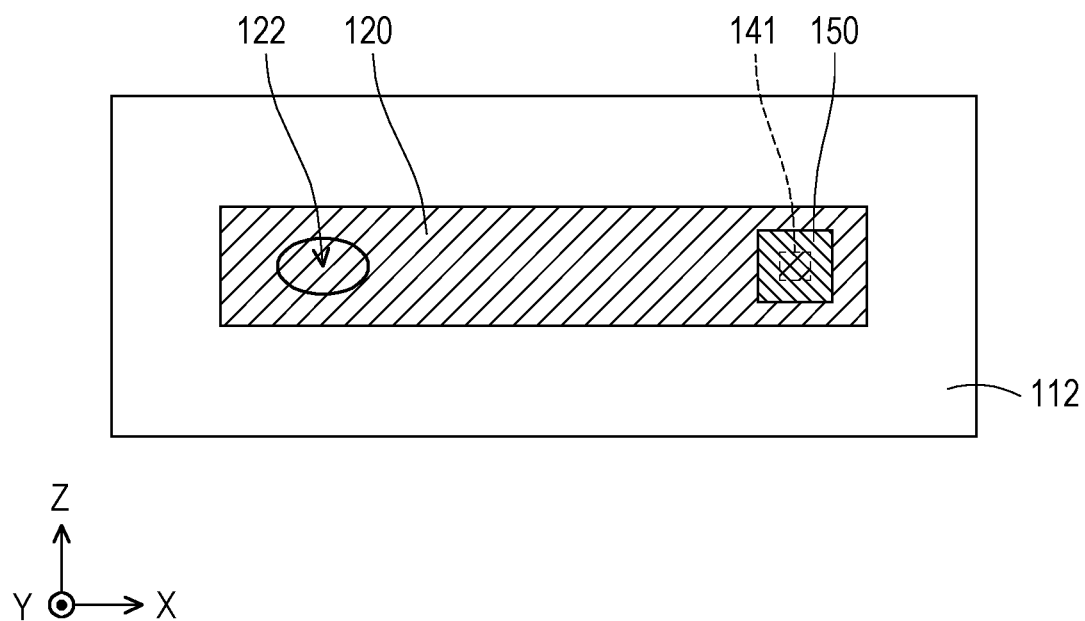
FIG. 1C is a schematic top view of an area A of FIG. 1B.

FIG. 1A to FIG. 1B are schematic cross-sectional views of a manufacturing method of a wafer structure according to an embodiment of the disclosure. FIG. 1C is a schematic top view of an area A of FIG. 1B. For the clarity of the drawings and the convenience of description, some elements in a wafer structure 100 are omitted in FIG. 1C. For example, a dielectric layer 114, a first dielectric layer 130, a second dielectric layer 160, and a third dielectric layer 140 are omitted, but the disclosure is not limited thereto.

First, referring to FIG. 1A, a substrate structure 110 and a wafer structure 200 bonded to the substrate structure 110 are provided. The substrate structure 110 has multiple dies (not shown) and a front side surface FS and a backside surface BS opposite to each other. The substrate structure 110 may include a substrate 112 (e.g., a silicon substrate), multiple conductive vias 113 (e.g., TSVs), the dielectric layer 114, interconnection elements 115, pads 116, vias 117, semiconductor elements (not shown) and doped regions (not shown), but the disclosure is not limited thereto. The front side surface FS of the substrate structure 110 is a side of the dielectric layer 114 away from the substrate 112, and the backside surface BS of the substrate structure 110 is a side of the substrate 112 away from the dielectric layer 114.

Specifically, the dielectric layer 114 is disposed on the substrate 112. The interconnection element 115 is embedded in the dielectric layer 114 and is electrically connected to the semiconductor element and/or the doped region. The pads 116 are disposed on the side (i.e., the front side surface FS) of the dielectric layer 114 away from the substrate 112 for bonding and electrically connected to the wafer structure 200. The pads 116 can be electrically connected to the interconnection elements 115 through the vias 117. The conductive vias 113 penetrate through the substrate 112 to be electrically connected to the interconnection elements 115 (not shown) in the dielectric layer 114. In other embodiments, the substrate structure 110 may further include electrodes or a combination of the elements. Those skilled in the art can adjust the specific composition of the substrate structure 110 according to product requirements, which is not limited in the disclosure.

Next, multiple test pads 120 are formed on the substrate 112 of the substrate structure 110. Specifically, in the embodiment, the test pads 120 are disposed on the side (i.e., the backside surface BS) of the substrate 112 away from the dielectric layer 114, so that the test pads 120 and the dielectric layer 114 are located on the opposite sides of the substrate 112, respectively. The test pad 120 has a test surface 121 away from the substrate structure 110. The test pads 120 are not electrically connected to one another. Each test pad 120 can be in contact with the corresponding conductive via 113, so that each test pad 120 can be electrically connected to the substrate structure 110 and the corresponding die through the corresponding conductive via 113. In addition, a thickness T of the test pad 120 in the normal direction (i.e., the direction Y) of the substrate structure 110 is greater than about 0.5 μm, and it is suitable for electrical tests such as chip probing test (CP test) or wafer acceptance test (WAT test), but the disclosure is not limited thereto.

In the embodiment, the direction X, the direction Y, and the direction Z are different directions. For example, the direction X is, for example, the extending direction of the substrate 112; the direction Y is, for example, the normal direction of the substrate structure 110; the direction X is perpendicular to the direction Y, and the direction X and the direction Y are perpendicular to the direction Z, respectively, but the disclosure is not limited thereto.

Next, the first dielectric layer 130 is formed on the substrate 112 of the substrate structure 110, so that the test pads 120 can be disposed in the first dielectric layer 130 and exposed outside the first dielectric layer 130. Specifically, in the embodiment, the first dielectric layer 130 is disposed on the side of the substrate 112 away from the dielectric layer 114, so that the first dielectric layer 130 and the dielectric layer 114 are located on opposite sides of the substrate 112, respectively. The first dielectric layer 130 has a first surface 131 away from the substrate structure 110. The first surface 131 of the first dielectric layer 130 may be flush with the test surface 121 of the test pad 120, but the disclosure is not limited thereto. In addition, the test surface 121 of the test pad 120 may be exposed outside the first dielectric layer 130 and not covered by the first dielectric layer 130.

In the embodiment, the test pads 120 are not electrically connected to one another and the test pads 120 may be disposed corresponding to the die, respectively, so after the test pads 120 are formed, probes P can be used to perform electrical tests such as chip probing test or wafer acceptance test on each test pad 120 to detect the electrical quality or electrical connection between each test pad 120 and the corresponding die. However, the probes P are in contact with the test surfaces 121 of the test pads 120 for chip probing test or wafer acceptance test, so probe marks 122 are generated on the test surface 121 of each of the test pads 120 in contact with the probes P, and the flatness of the test surface 121 is damaged. In the embodiment, the probe mark 122 is, for example, probe marked from the test surface 121 of the test pad 120 toward the substrate structure 110, and the probe mark 122 does not penetrate the test pad 120, but the disclosure is not limited thereto. In addition, in the embodiment, the contour of the probe mark 122 may be, for example, an arc shape, but the disclosure is not limited thereto. In other embodiments, the contour of the probe mark 122 may also be a tapered shape. The depth D of the probe mark 122 in the normal direction (i.e., the direction Y) of the substrate structure 110 is about 200 nm to 300 nm, but the disclosure is not limited thereto.

Next, referring to FIG. 1B, after the electrical test is performed, the third dielectric layer 140 is formed on the first dielectric layer 130 and the test pad 120. The third dielectric layer 140 can cover the first dielectric layer 130 and the test pad 120, and the third dielectric layer 140 can also be disposed in the probe mark 122 to fill the probe mark 122.

Next, multiple bond pads 150 are formed on the third dielectric layer 140, and multiple first conductive holes 141 are formed and penetrate through the third dielectric layer 140. In the embodiment, each bond pad 150 can be electrically connected to the corresponding test pad 120 through the corresponding first conductive hole 141. That is, the first conductive holes 141 can be electrically connected to each bond pad 150 and the corresponding test pad 120 respectively. Each of the first conductive holes 141 is in contact with the corresponding test surface 121 of the test pad 120 but is not in contact with the corresponding probe mark 122 of the test pad 120. In the embodiment, the bond pads 150 are not electrically connected to one another. The bond pads 150 have bonding surfaces 151 away from the test pads 120.

In the embodiment, in the normal direction (i.e., the direction Y) of the substrate structure 110, each of the first conductive holes 141 is overlapped with the corresponding test pad 120, and each of the first conductive holes 141 is not overlapped with the corresponding probe mark 122 of the test pad 120. That is, the first conductive holes 141 and the probe marks 122 are disposed in a staggered manner. In addition, in the embodiment, in the normal direction (i.e., the direction Y) of the substrate structure 110, each bond pad 150 is overlapped with the corresponding test pad 120, and each bond pad 150 is not overlapped with the probe mark 122 of the corresponding test pad 120. That is, the bond pads 150 and the probe marks 122 are disposed in a staggered manner.

Next, a second dielectric layer 160 is formed on the first dielectric layer 130 and the third dielectric layer 140, so that the bond pads 150 can be disposed in the second dielectric layer 160 and exposed outside the second dielectric layer 160. Specifically, the second dielectric layer 160 may be disposed on the surface of the third dielectric layer 140 away from the substrate structure 110, so that the third dielectric layer 140 is disposed between the first dielectric layer 130 and the second dielectric layer 160. The second dielectric layer 160 has a top surface 161 away from the test pads 120. The bonding surface 151 of the bond pad 150 is flush with the top surface 161 of the second dielectric layer 160, but the disclosure is not limited thereto. In addition, the bonding surface 151 of the bond pad 150 may be exposed outside the second dielectric layer 160 and not covered by the second dielectric layer 160. At the phase, the manufacture of the wafer structure 100 of the embodiment has been completed.

Figure 9:
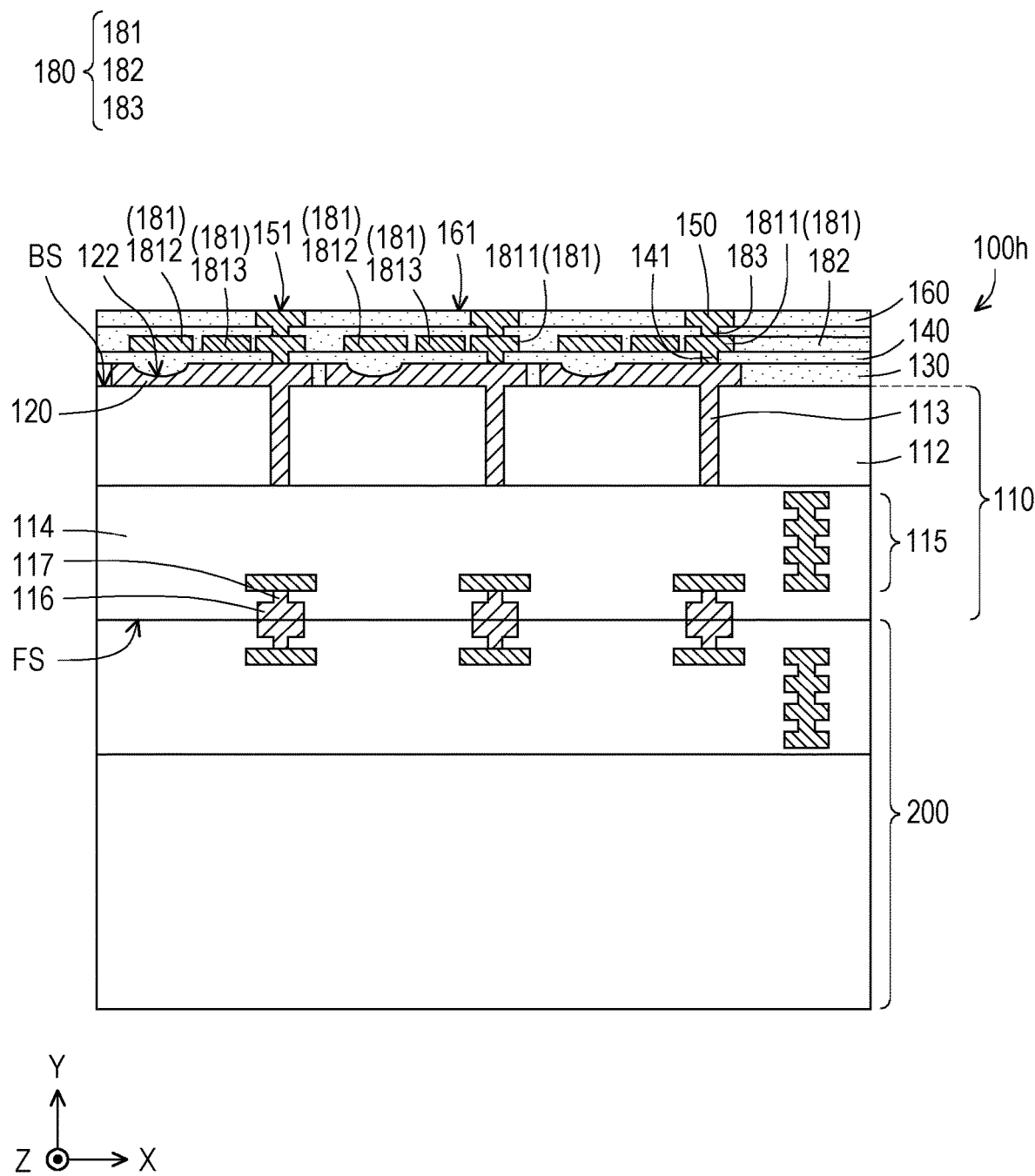
FIG. 9 is a schematic cross-sectional view of a wafer structure according to another embodiment of the disclosure.

Referring to FIG. 1C, in the embodiment, in the schematic top view of the region A of the wafer structure 100, the extending direction of the test pads 120 may be substantially parallel to the extending direction (i.e., the direction X) of the substrate 112, but the disclosure is not limited. In some embodiments, the extending direction of the test pad 120 may not be parallel to the extending direction (i.e., the direction X) of the substrate 112, as shown in FIG. 9.

Figure 3:
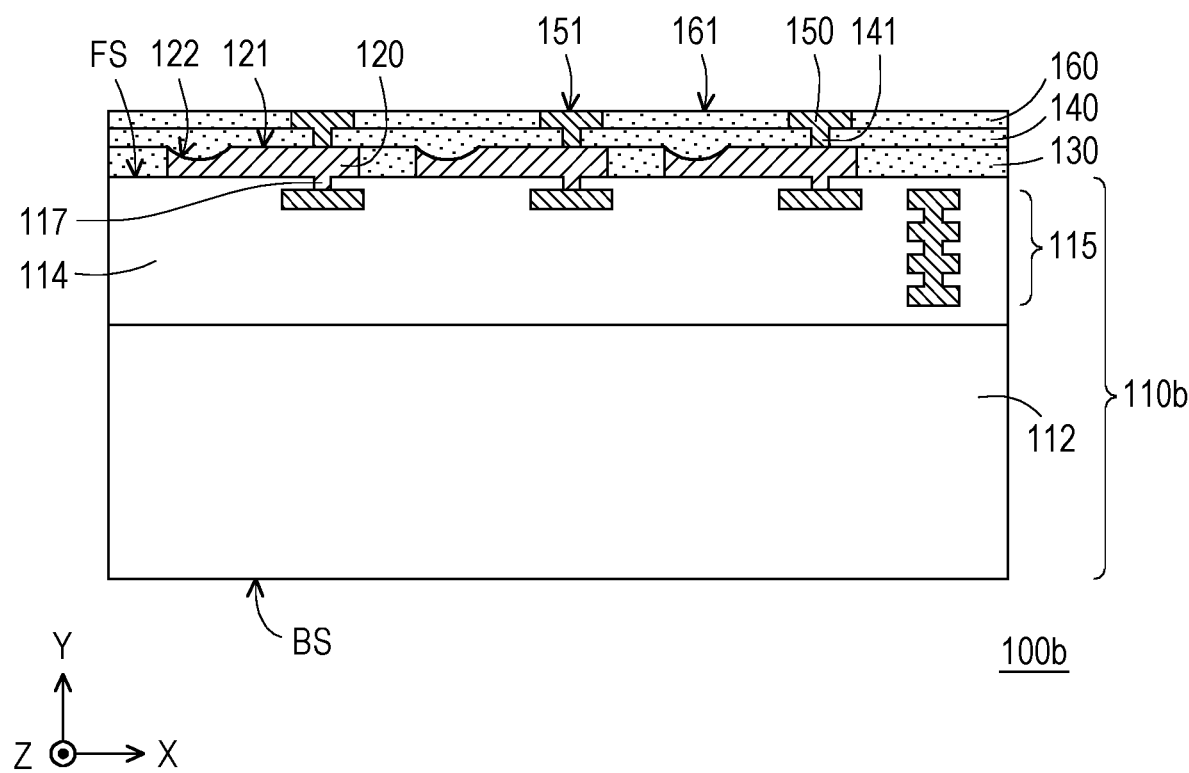
FIG. 3 is a schematic cross-sectional view of a wafer structure according to another embodiment of the disclosure.

Although the wafer structure 100 and the manufacturing method thereof in the embodiment are to dispose the test pads 120 and the bond pads 150 on the backside surface BS of the substrate structure 110, the disclosure is not limited thereto. In some embodiments, the test pads 120 and the bond pads 150 may also be disposed on the front side surface FS of the substrate structure 110, as shown in FIG. 3.

In the wafer structure 100 and the manufacturing method thereof of the embodiment, the additionally disposed bond pads 150 may have favorable flatness than the test pad 120 having the probe mark 122. Therefore, compared with the general wafer structure, in the wafer structure 100 of the embodiment, multiple bond pads 150 with favorable flatness can be used to replace the test pads 120 having the probe marks 122, the bond pads 150 are used to perform hybrid bonding with another wafer structure, and accordingly favorable bonding quality can be ensured during wafer bonding, so that no air bubbles are generated between the two corresponding bond pads after bonding, and there is a lower resistance value at the place where the wafers bond.

In short, the wafer structure 100 of the embodiment includes the substrate structure 110, the first dielectric layer 130, the test pads 120, the second dielectric layer 160, and the bond pads 150. The first dielectric layer 130 is disposed on the substrate structure 110. The test pads 120 are disposed in the first dielectric layer 130 and exposed outside the first dielectric layer 130. Each test pad 120 has the probe mark 122. The second dielectric layer 160 is disposed on the first dielectric layer 130. The second dielectric layer 160 has the top surface 161 away from the test pads 120. The bond pads 150 are disposed in the second dielectric layer 160 and are exposed outside the second dielectric layer 160. Each bond pad 150 is electrically connected to the corresponding test pad 120. The bond pads 150 have bonding surfaces 151 away from the test pads 120. The bonding surface 151 is flush with the top surface 161. In the normal direction (i.e., the direction Y) of the substrate structure 110, each bond pad 150 is not overlapped with the corresponding probe mark 122 of the test pad 120.

Other embodiments are illustrated in the subsequent paragraphs. Note that in the following embodiments, the reference numerals and part of the contents of the previous embodiments are used, the same reference numerals are used to represent the same or similar elements, and the description of the same technical contents is omitted. For the description of the omitted part, refer to the foregoing embodiments, which is not repeated in the following embodiments.

Figure 2:
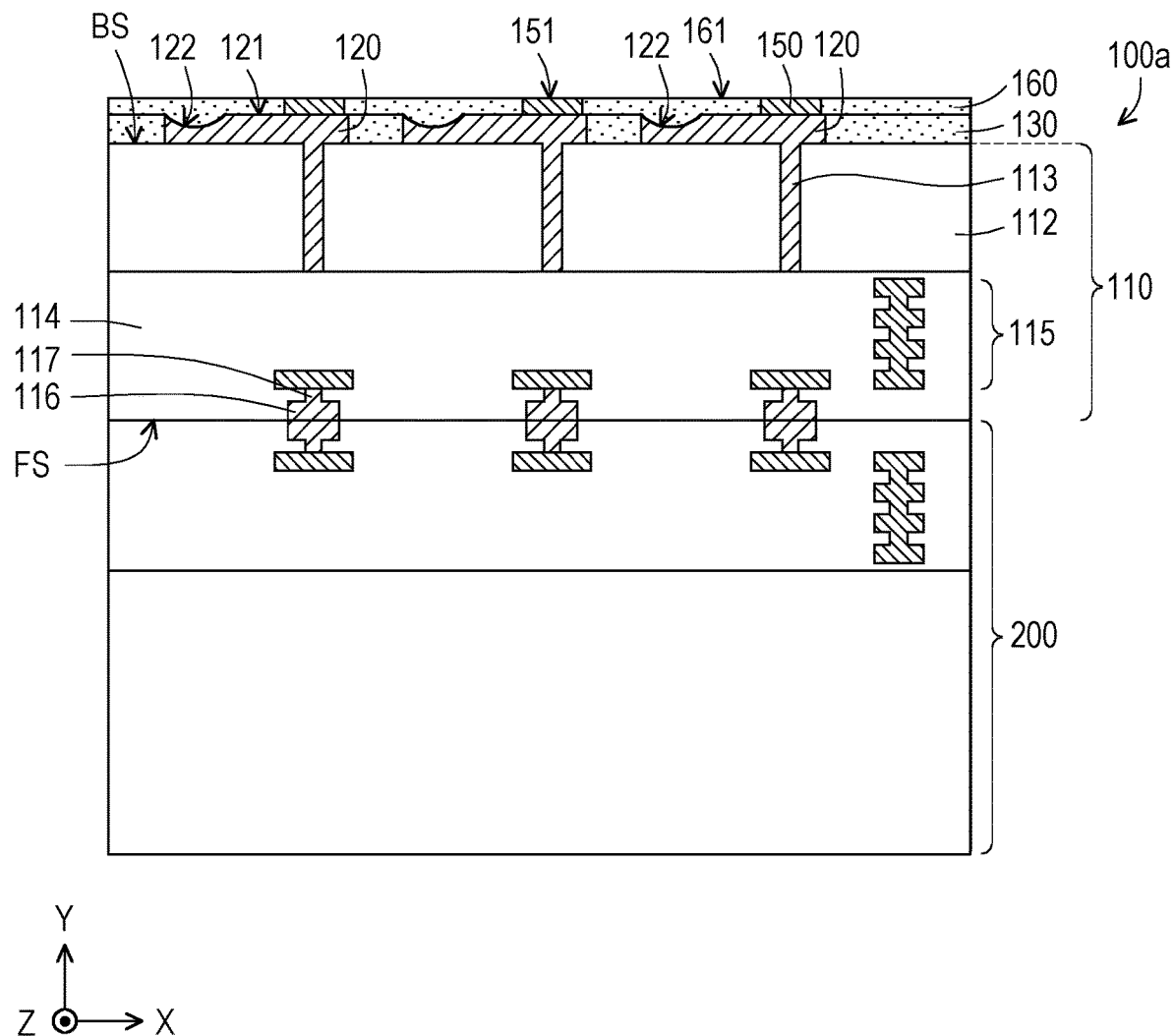
FIG. 2 is a schematic cross-sectional view of a wafer structure according to another embodiment of the disclosure.

FIG. 2 is a schematic cross-sectional view of a wafer structure according to another embodiment of the disclosure. Referring to both FIG. 1B and FIG. 2, a wafer structure 100a of the embodiment is similar to the wafer structure 100 in FIG. 1B, and the main difference between the two is that in the wafer structure 100a of the embodiment, the third dielectric layer 140 and the first conductive holes 141 in the wafer structure 100 of FIG. 1B can be omitted.

Specifically, referring to FIG. 2, in the embodiment, after the first dielectric layer 130 and the test pads 120 are formed and the chip probing test or wafer acceptance test is performed, the bond pads 150 and the second dielectric layer 160 are formed on the first dielectric layer 130 and the test pad 120. Each bond pad 150 may be in contact with and be electrically connected to the corresponding test pad 120. The second dielectric layer 160 may be disposed in the probe mark 122 of the test pad 120 to fill the probe mark 122.

In addition, in the embodiment, in the normal direction (i.e., the direction Y) of the substrate structure 110, each bond pad 150 is overlapped with the corresponding test pad 120, and each bond pad 150 is not overlapped with the probe mark 122 of the corresponding test pad 120. That is, the bond pads 150 and the probe marks 122 are disposed in a staggered manner. In the embodiment, each bond pad 150 is in contact with the test surface 121 of the corresponding test pad 120 but not in contact with the corresponding probe mark 122 of the test pad 120.

Although the wafer structure 100a and the manufacturing method thereof in the embodiment are to dispose the test pads 120 and the bond pads 150 on the backside surface BS of the substrate structure 110, the disclosure is not limited thereto. In some embodiments, test pads and bond pads may also be disposed on the front side surface of the substrate structure.

FIG. 3 is a schematic cross-sectional view of a wafer structure according to another embodiment of the disclosure. Referring to both FIG. 1B and FIG. 3, a wafer structure 100b of the embodiment is similar to the wafer structure 100 in FIG. 1B, and the main difference between the two is that in the wafer structure 100b of the embodiment, the test pads 120 and the bond pads 150 can be disposed on the dielectric layer 114 of a substrate structure 110b.

Specifically, referring to FIG. 3, in the embodiment, the test pads 120 are disposed on the side (i.e., the front side surface FS) of the dielectric layer 114 away from the substrate 112. The test pads 120 and the substrate 112 are located on opposite sides of the dielectric layer 114, respectively. Each test pad 120 can be electrically connected to the interconnection element 115 through the corresponding via 117. Each bond pad 150 can be electrically connected to the substrate structure 110b and the corresponding die (not shown) through the corresponding first conductive hole 141, the corresponding test pad 120, the corresponding via 117, and the corresponding interconnection element 115. In addition, unlike the wafer structure 100 of FIG. 1B, in the wafer structure 100b of the embodiment, pads may not be disposed on the dielectric layer 114 in the substrate structure 110b and multiple conductive vias may not be disposed on the substrate 112, but the disclosure is not limited thereto.

Figure 4A:
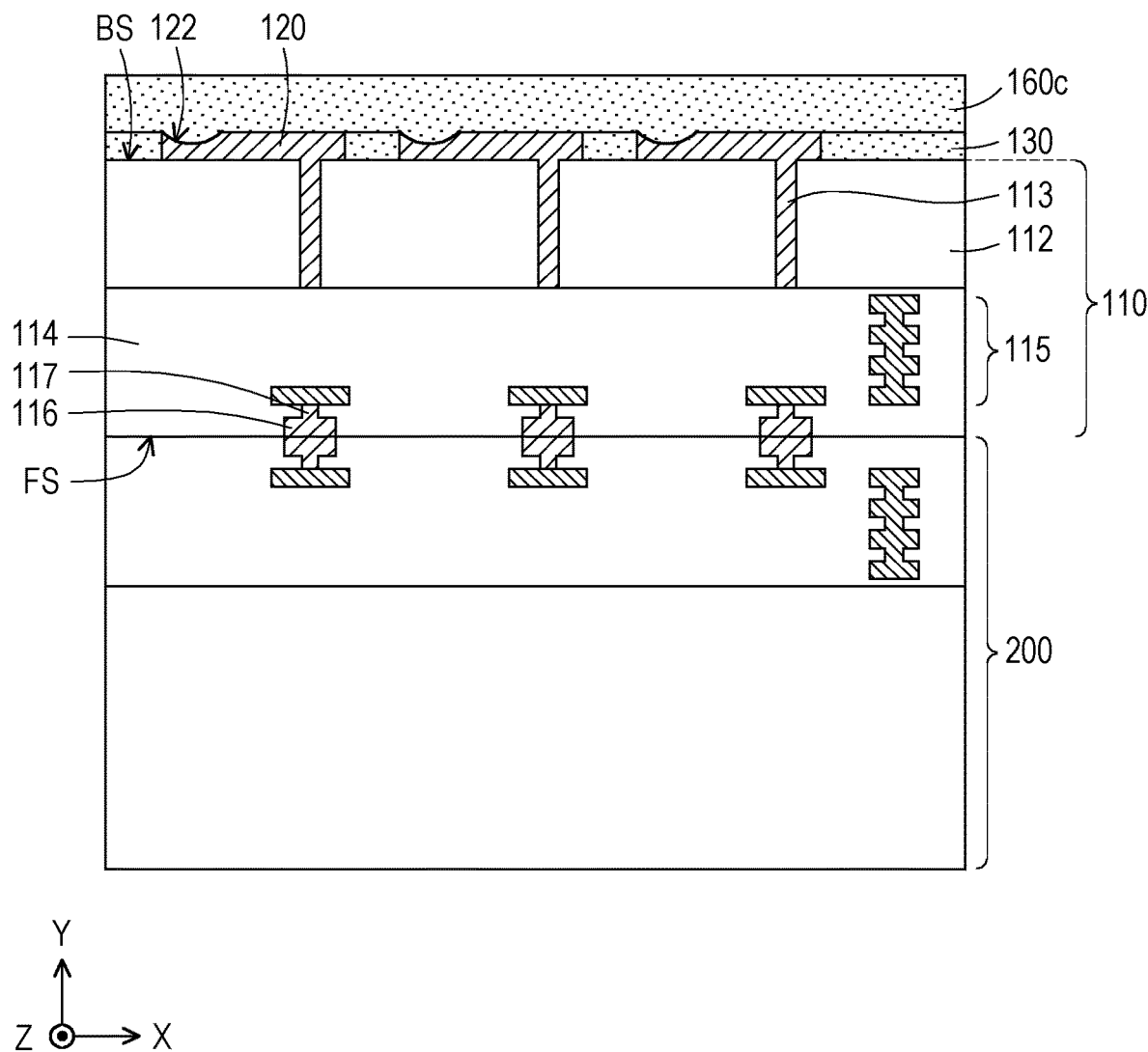
FIG. 4A to FIG. 4B are schematic cross-sectional views of a manufacturing method of a wafer structure according to another embodiment of the disclosure.
Figure 4B:
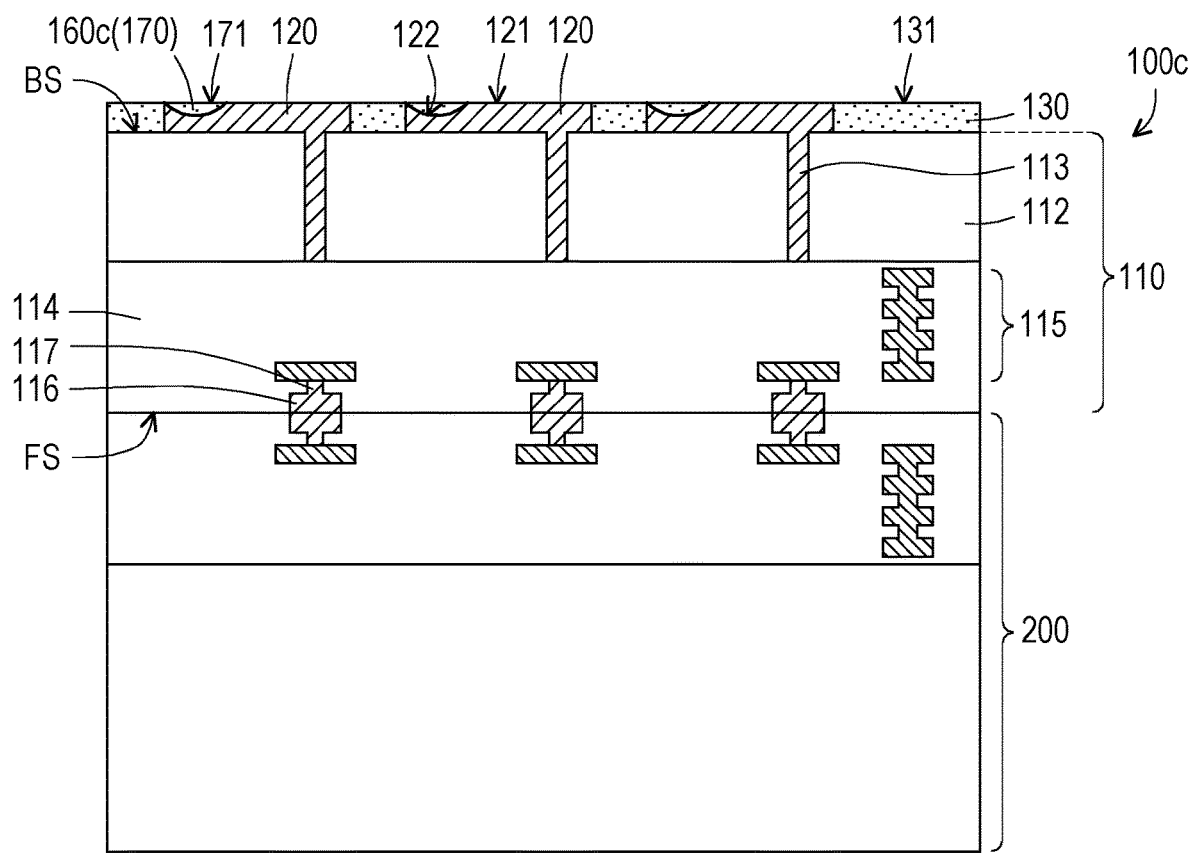

FIG. 4A to FIG. 4B are schematic cross-sectional views of a manufacturing method of a wafer structure according to another embodiment of the disclosure. FIG. 4A to FIG. 4B are steps continuing from FIG. 1A and replacing FIG. 1B. The same or similar elements in the embodiment of FIG. 4A to FIG. 4B and the embodiment of FIG. 1A to FIG. 1B can be configured by using the same materials or methods, so the same and similar descriptions in the two embodiments may not be repeated in the subsequent paragraphs, and mainly the differences between the two embodiments are illustrated.

Specifically, referring to FIG. 4A, after the first dielectric layer 130 and the test pads 120 are formed and the chip probing test or wafer acceptance test is performed, a second dielectric layer 160c is formed on the first dielectric layer 130 and the test pads 120. The second dielectric layer 160c may be directly in contact with and cover the first dielectric layer 130 and the test pad 120, and the second dielectric layer 160c can also be disposed in the probe mark 122 of the test pad 120 to fill the probe mark 122. In addition, in the embodiment, the material of the second dielectric layer 160c may be, for example, oxide (e.g., silicon oxide) or polymer (e.g., polyimide (PI)), and the like, but the disclosure is not limited thereto.

Next, referring to FIG. 4B, part of the second dielectric layer 160c is removed to expose the first dielectric layer 130 and the test pads 120. Specifically, in the embodiment, the second dielectric layer 160c is polished through a chemical mechanical planarization (CMP) process to expose the test surface 121 of the test pad 120 away from the substrate structure 110 and the first surface 131 of the first dielectric layer 130 away from the substrate structure 110. Meanwhile, another part of the second dielectric layer 160c is remained in the probe mark 122 of the test pad 120 to form a filling structure 170. In the embodiment, the filling structure 170 has an upper surface 171 away from the substrate structure 110, and the upper surface 171 of the filling structure 170, the test surface 121 of the test pad 120, and the first surface 131 of the first dielectric layer 130 are flush. In addition, the filling structure 170, and the test pad 120 are formed in different processes, so there may be an interface between the filling structure 170 and the test pad 120. At the phase, the manufacture of a wafer structure 100c of the embodiment has been completed.

In the wafer structure 100c and the manufacturing method thereof of the embodiment, by disposing the filling structure 170 in the probe mark 122 of the test pad 120, after the chip probing test or the wafer acceptance test, the flatness of the test pad 120 can be improved. Therefore, compared with the general wafer structure, a wafer structure 100d of the embodiment can utilize the test pads 120 with improved flatness for hybrid bonding with another wafer structure, and accordingly favorable bonding quality can be ensured during wafer bonding, so that no air bubbles are generated between the two corresponding test pads after bonding, and there is a lower resistance value at the place where the wafers bond.

Although the wafer structure 100c and the manufacturing method thereof in the embodiment are to dispose the test pads 120 and the filling structure 170 on the backside surface BS of the substrate structure 110, the disclosure is not limited thereto. In some embodiments, the test pads and the filling structure may also be disposed on the front side surface of the substrate structure.

In short, the wafer structure 100c of the embodiment includes the substrate structure 110, the first dielectric layer 130, the test pads 120, and the filling structure 170. The first dielectric layer 130 is disposed on the substrate structure 110 and has the first surface 131 away from the substrate structure 110. The test pads 120 are disposed in the first dielectric layer 130 and exposed outside the first dielectric layer 130. Each test pad 120 has the probe mark 122 and the test surface 121 away from the substrate structure 110. The filling structure 170 is disposed in the probe mark 122 of each test pad 120 and has the upper surface 171 away from the substrate structure 110. The upper surface 171 of the filling structure 170, the test surface 121 of the test pad 120, and the first surface 131 of the first dielectric layer 130 are flush with each other.

Figure 5:
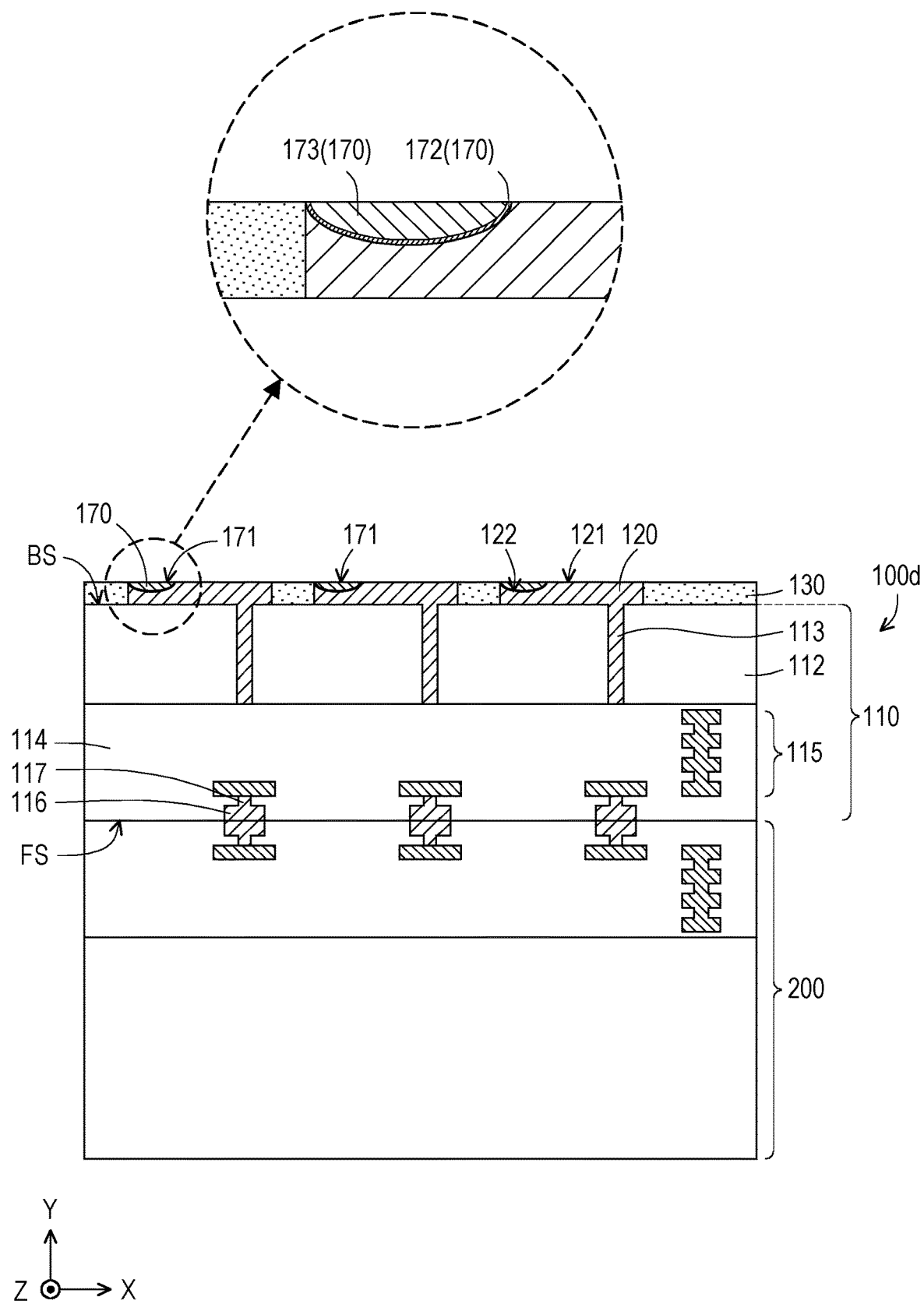
FIG. 5 is a schematic cross-sectional view of a wafer structure according to another embodiment of the disclosure.

FIG. 5 is a schematic cross-sectional view of a wafer structure according to another embodiment of the disclosure. Referring to both FIG. 4B and FIG. 5, the wafer structure 100d of the embodiment is similar to the wafer structure 100c of FIG. 4B, but the main difference between the two is that in the wafer structure 100d of the embodiment, the filling structure 170 includes a seed layer 172 and a metal layer 173.

Specifically, referring to FIG. 5, in the embodiment, after the first dielectric layer 130 and the test pads 120 are formed and the chip probing test or wafer acceptance test is performed, the seed layer 172 is formed in the probe mark 122 of each test pad 120 so that the seed layer 172 can conform to the contour of the probe mark 122. Next, the metal layer 173 is formed on the seed layer 172 to fill the probe mark 122. In the embodiment, the seed layer 172 is disposed between the metal layer 173 and the test pad 120. The seed layer 172 and the metal layer 173 together form the filling structure 170. The test pads 120 have the test surfaces 121 away from the substrate structure 110, the first dielectric layer 130 has the first surface 131 away from the substrate structure 110, the filling structure 170 has the upper surface 171 away from the substrate structure 110, and the upper surface 171, the test surface 121, and the first surface 131 are flush. In addition, in the embodiment, the materials of the seed layer 172 and the metal layer 173 may be metal conductive materials, such as copper, aluminum, or the like, for example, but the disclosure is not limited thereto.

In the embodiment, the manufacturing method of the filling structure 170 of the wafer structure 100d may, for example, include the following steps (not shown), but the disclosure is not limited thereto. The seed layer 172 is formed on the first dielectric layer 130 and the test pads 120 so that the seed layer 172 is in contact with and conforms to the first dielectric layer 130 and the test pads 120 having the probe marks 122. Next, a metal layer 173 is formed on the seed layer 172, so that the metal layer 173 covers the seed layer 172 and fills the probe mark 122 of each test pad 120. Then, part of the seed layer 172 and part of the metal layer 173 are removed through a chemical mechanical planarization process to expose the test surface 121 of the test pad 120 away from the substrate structure 110 and the first surface 131 of the first dielectric layer 130 away from the substrate structure 110. Meanwhile, another part of the seed layer 172 and another part of the metal layer 173 are remained in the probe mark 122 of the test pad 120 to form the filling structure 170. At the phase, the manufacture of the filling structure 170 of the wafer structure 100d of the embodiment has been completed.

Although the wafer structure 100d and the manufacturing method thereof in the embodiment are to dispose the test pad 120 and the filling structure 170 on the backside surface BS of the substrate structure 110, the disclosure is not limited thereto. In some embodiments, the test pad and the filling structure may also be disposed on the front side surface of the substrate structure.

Figure 6:
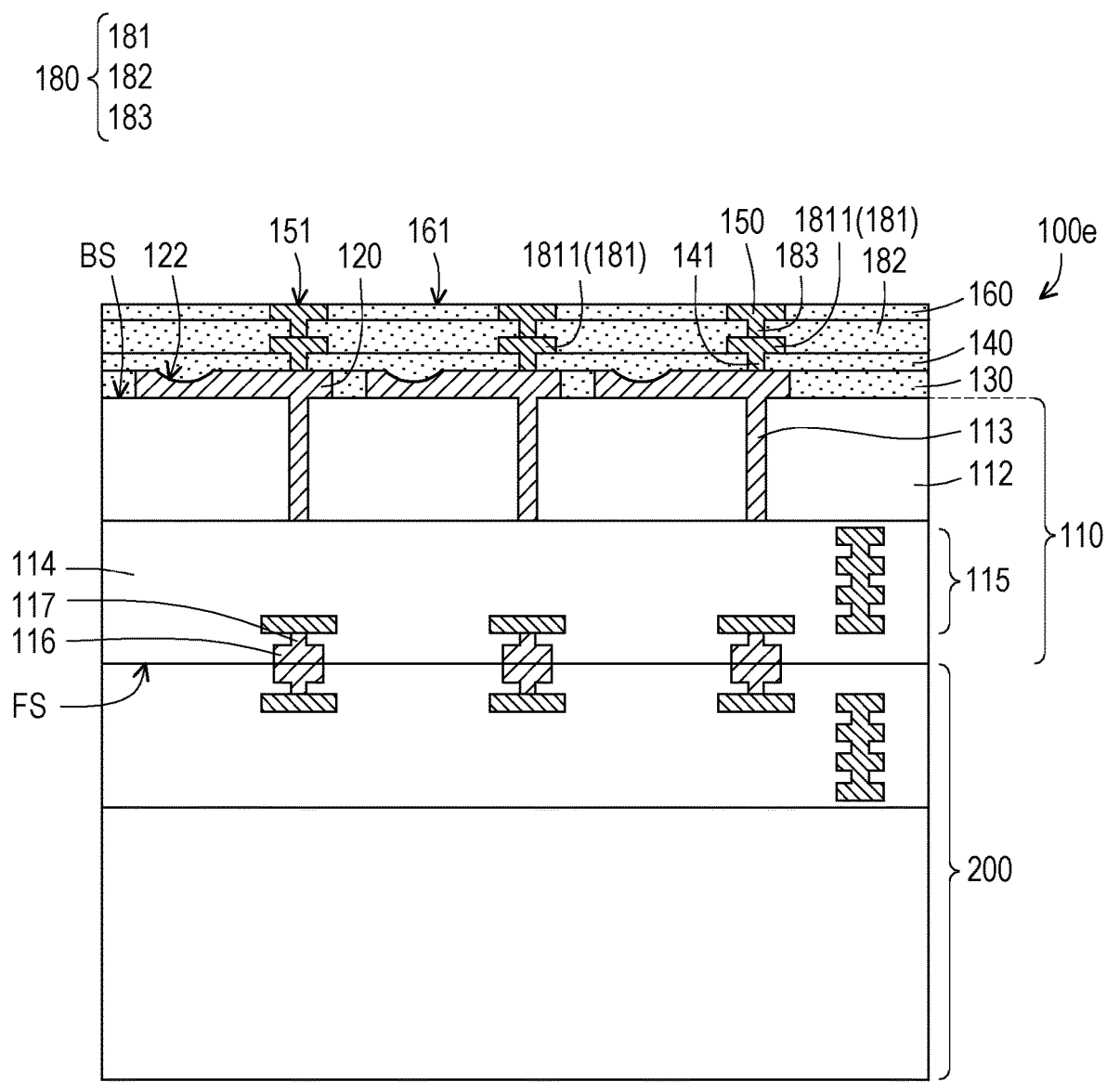
FIG. 6 is a schematic cross-sectional view of a wafer structure according to another embodiment of the disclosure.

FIG. 6 is a schematic cross-sectional view of a wafer structure according to another embodiment of the disclosure. Referring to both FIG. 1B and FIG. 6, a wafer structure 100e of the embodiment is similar to the wafer structure 100 in FIG. 1B, and the main difference between the two is that the wafer structure 100e of the embodiment further includes a redistribution layer (RDL) 180.

Specifically, referring to FIG. 6, in the embodiment, the redistribution layer 180 is disposed between the second dielectric layer 160 and the third dielectric layer 140. The redistribution layer 180 includes at least one circuit layer 181 (one layer is schematically illustrated in FIG. 6), at least one fourth dielectric layer 182 (one layer is schematically illustrated in FIG. 6), and multiple second conductive holes 183. The circuit layer 181 is disposed on the third dielectric layer 140, and the circuit layer 181 includes multiple first pads 1811. The first pads 1811 are in contact with and electrically connected to the corresponding first conductive holes 141, respectively. The first pads 1811 are not electrically connected to one another. The fourth dielectric layer 182 is disposed on the circuit layer 181 to cover the circuit layer 181 and the third dielectric layer 140. The second conductive holes 183 penetrate through the fourth dielectric layer 182 and are electrically connected to the corresponding bond pads 150 and the corresponding first pads 1811, respectively.

In the embodiment, in the normal direction (i.e., the direction Y) of the substrate structure 110, each first pad 1811 is overlapped with the corresponding test pad 120, and each first pad 1811 is not overlapped with the probe mark 122 of the corresponding test pad 120. That is, the first pads 1811 and the probe marks 122 are disposed in a staggered manner.

Although the redistribution layer 180 in the embodiment schematically includes one layer of the circuit layer 181 and one layer of the fourth dielectric layer 182, the disclosure does not limit the quantity of the circuit layers 181 and the quantity of the fourth dielectric layers 182. That is, in some embodiments, the redistribution layer may also include two or more circuit layers and fourth dielectric layers according to requirements.

Although the wafer structure 100e and the manufacturing method thereof in the embodiment are to dispose the test pad 120, the redistribution layer 180, and the bond pad 150 on the backside surface BS of the substrate structure 110, the disclosure is not limited thereto. In some embodiments, the test pads, the redistribution layer, and the bond pads may also be disposed on the front side surface of the substrate structure.

Figure 7:
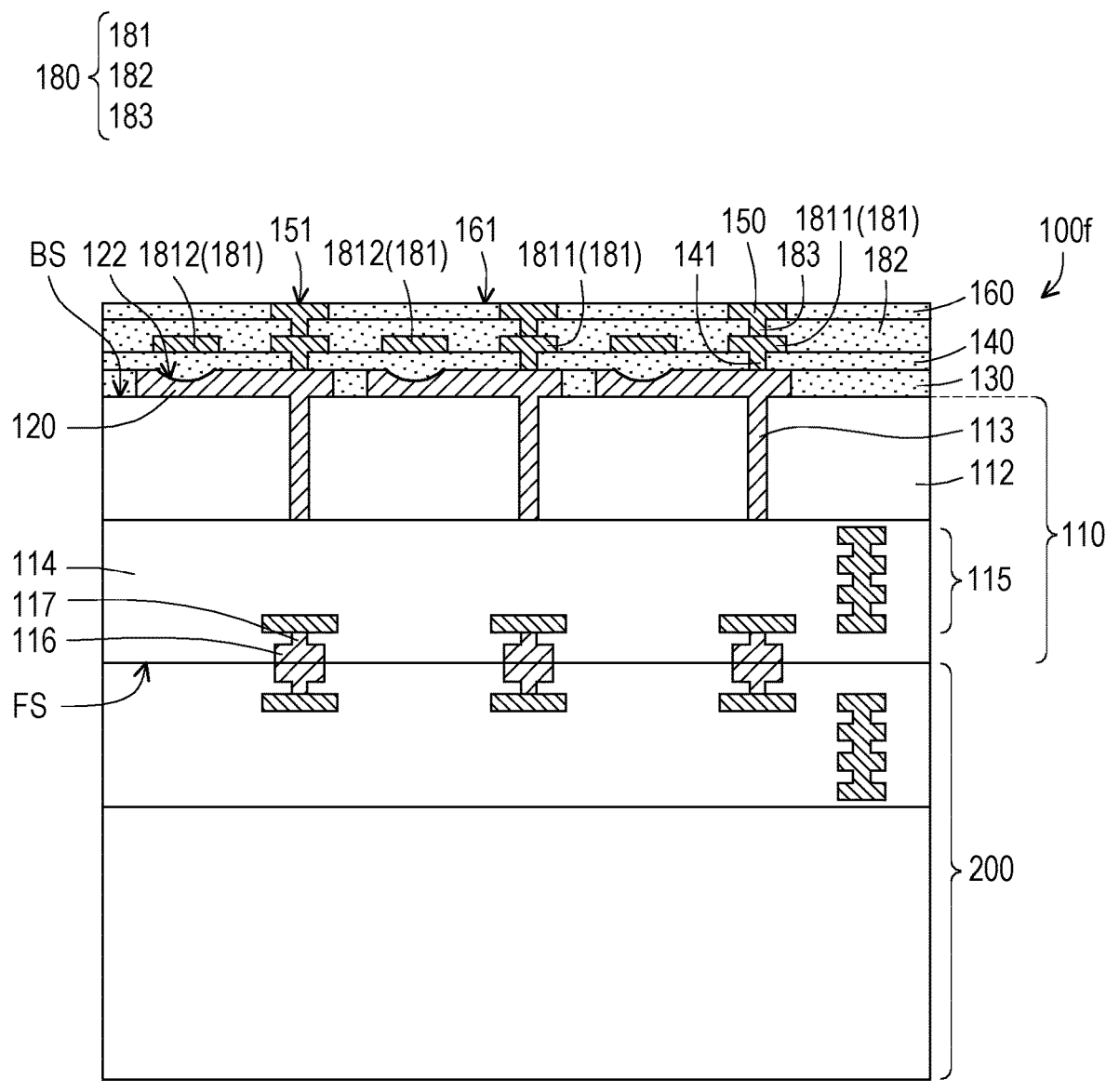
FIG. 7 is a schematic cross-sectional view of a wafer structure according to another embodiment of the disclosure.

FIG. 7 is a schematic cross-sectional view of a wafer structure according to another embodiment of the disclosure. Referring to both FIG. 6 and FIG. 7, a wafer structure 100f of the embodiment is similar to the wafer structure 100e in FIG. 6, and the main difference between the two is that in the wafer structure 100f of the embodiment, the circuit layer 181 further includes multiple second pads 1812.

Specifically, referring to FIG. 7, in the embodiment, the second pads 1812 are disposed corresponding to the probe marks 122 of the test pads 120, respectively. In the normal direction (i.e., the direction Y) of the substrate structure 110, each second pad 1812 is overlapped with the corresponding probe mark 122 of the test pad 120. The second pads 1812 are not electrically connected to one another. The second pads 1812 and the first pads 1811 are physically and electrically separated from one another. In the embodiment, the second pads 1812 can be regarded as dummy pads.

Figure 8:
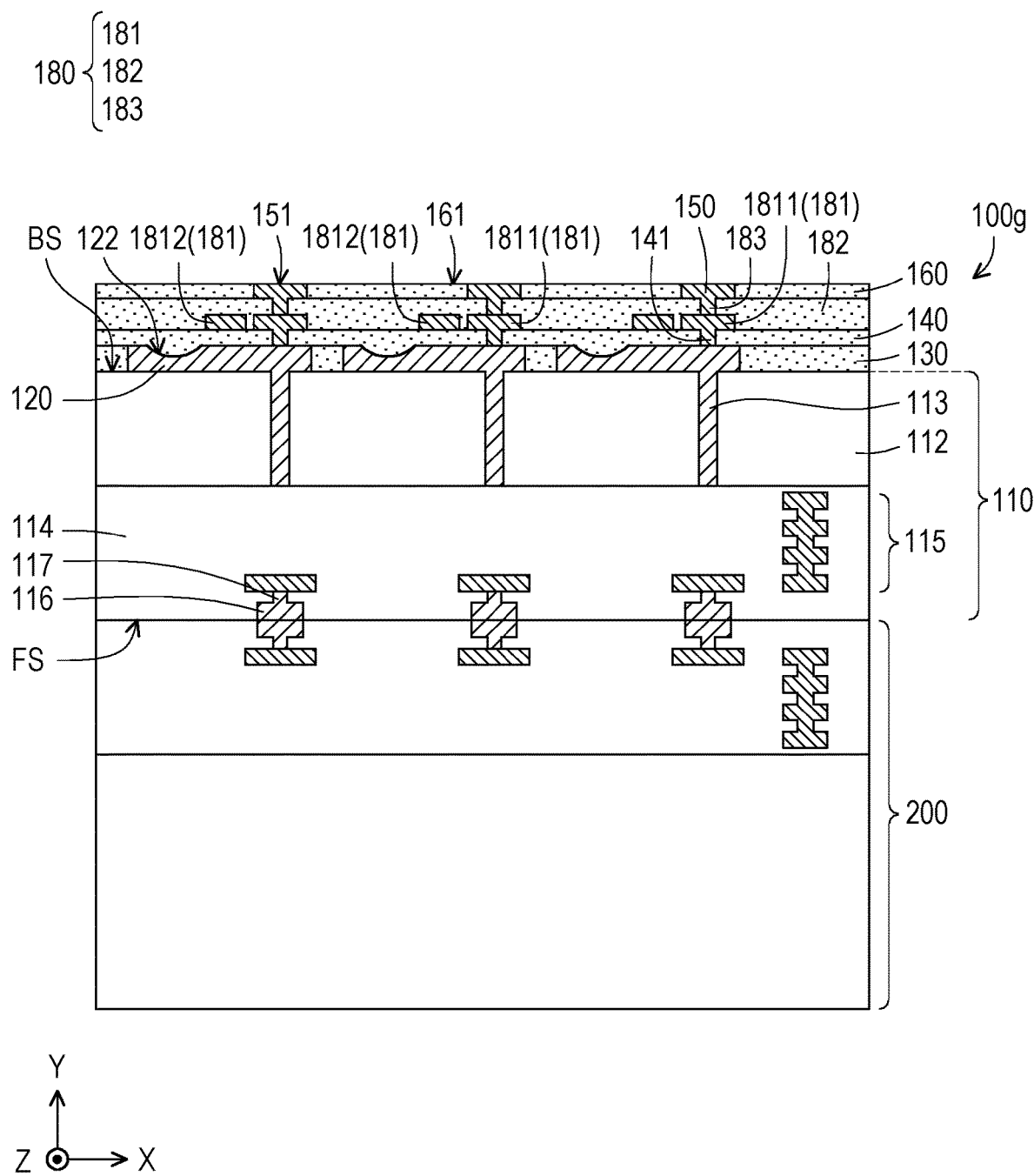
FIG. 8 is a schematic cross-sectional view of a wafer structure according to another embodiment of the disclosure.

FIG. 8 is a schematic cross-sectional view of a wafer structure according to another embodiment of the disclosure. Referring to both FIG. 7 and FIG. 8, a wafer structure 100g of the embodiment is similar to the wafer structure 100f in FIG. 7, and the main difference between the two is that in the wafer structure 100g of the embodiment, the second pads 1812 of the circuit layer 181 are disposed not corresponding to the probe marks 122 of the test pads 120.

Specifically, referring to FIG. 8, in the embodiment, in the normal direction (i.e., the direction Y) of the substrate structure 110, each second pad 1812 is overlapped with the corresponding test pad 120, and each second pad 1812 is not overlapped with the corresponding probe mark 122 of the test pad 120. That is, the second pads 1812 and the probe marks 122 are disposed in a staggered manner.

FIG. 9 is a schematic cross-sectional view of a wafer structure according to another embodiment of the disclosure. Referring to both FIG. 7 and FIG. 9, a wafer structure 100h of the embodiment is similar to the wafer structure 100f in FIG. 7, and the main difference between the two is that in the wafer structure 100h of the embodiment, the circuit layer 181 further includes multiple third pads 1813.

Specifically, referring to FIG. 9, in the embodiment, the third pads 1813 are disposed between the first pads 1811 and the second pads 1812, respectively. In the normal direction (i.e., the direction Y) of the substrate structure 110, each third pad 1813 is overlapped with the corresponding test pad 120, and each third pad 1813 is not overlapped with the corresponding probe mark 122 of the test pad 120. That is, the third pads 1813 and the probe marks 122 are disposed in a staggered manner. The third pads 1813 are not electrically connected to one another. The third pads 1813 and the second pads 1812 are physically and electrically separated from each other. In some embodiments, the third pads 1813 may be electrically connected to the first pads 1811, but the disclosure is not limited thereto.

Figure 10:
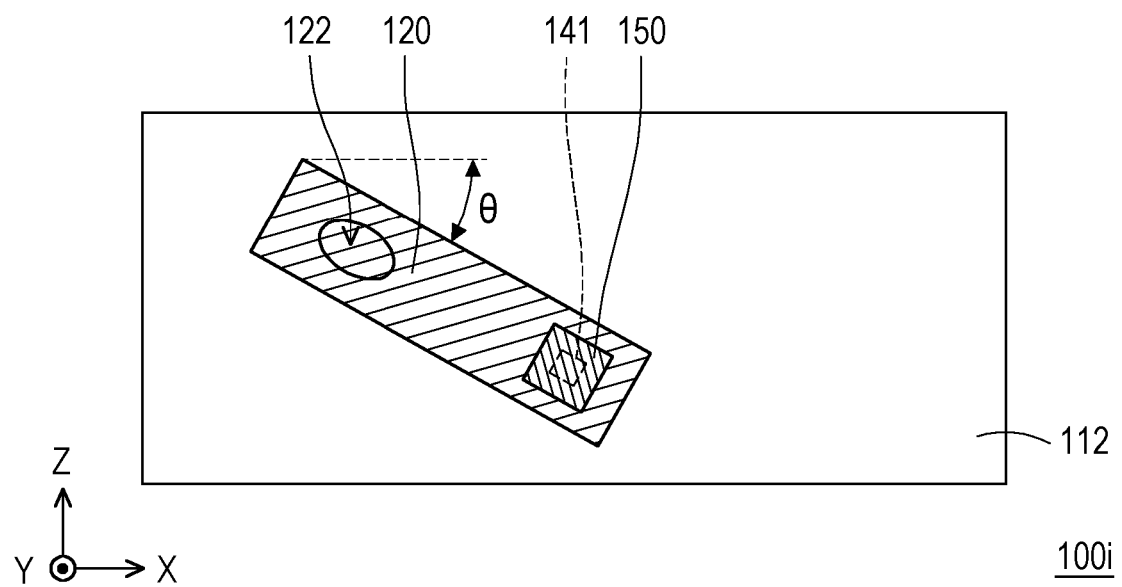
FIG. 10 is a schematic top view of part of a wafer structure according to another embodiment of the disclosure.

FIG. 10 is a schematic top view of part of a wafer structure according to another embodiment of the disclosure. Referring to both FIG. 1C and FIG. 10, a wafer structure 100i of the embodiment is similar to the wafer structure 100 in FIG. 1C, and the main difference between the two is that in the schematic top view of the wafer structure 100i of the embodiment, the extending direction of the test pad 120 is not parallel to the extending direction (i.e., the direction X) of the substrate 112.

Specifically, referring to FIG. 10, in the embodiment, there is an included angle θ between the extending direction of the test pad 120 and the extending direction (i.e., the direction X) of the substrate 112. The included angle θ is, for example, 45 degrees, but the disclosure is not limited thereto. In the embodiment, with the included angle θ, the configuration areas of the probe mark 122 and the bond pad 150 in a three-dimensional space can be reduced.

Figure 11:
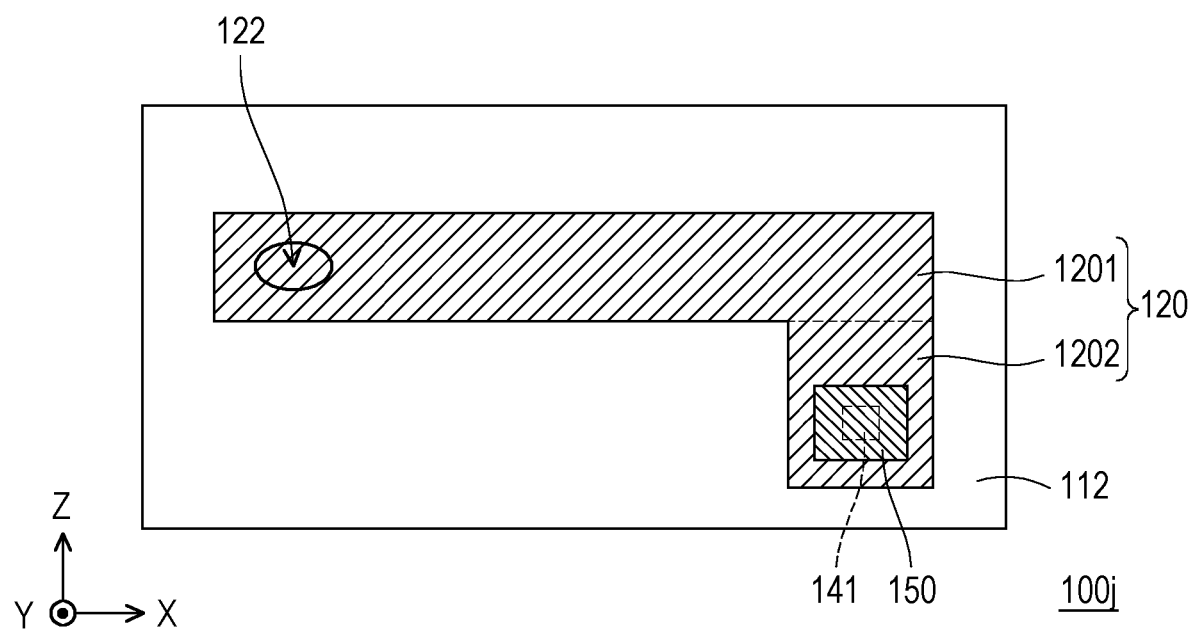
FIG. 11 to FIG. 13 are schematic top views of part of wafer structures according to various embodiments of the disclosure.
Figure 12:
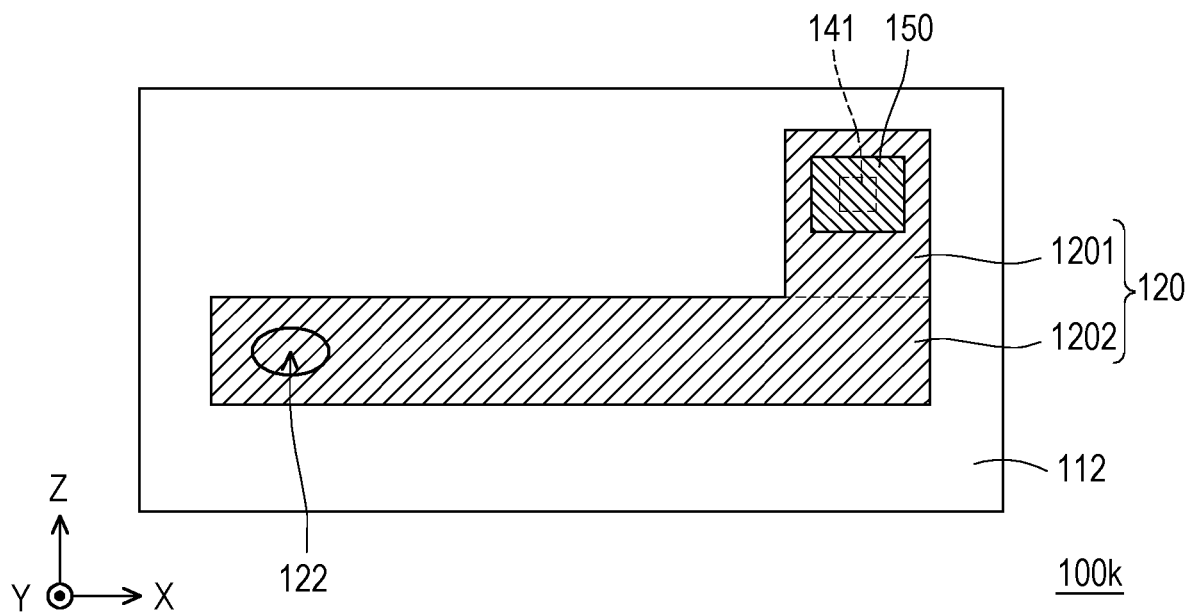
Figure 13:
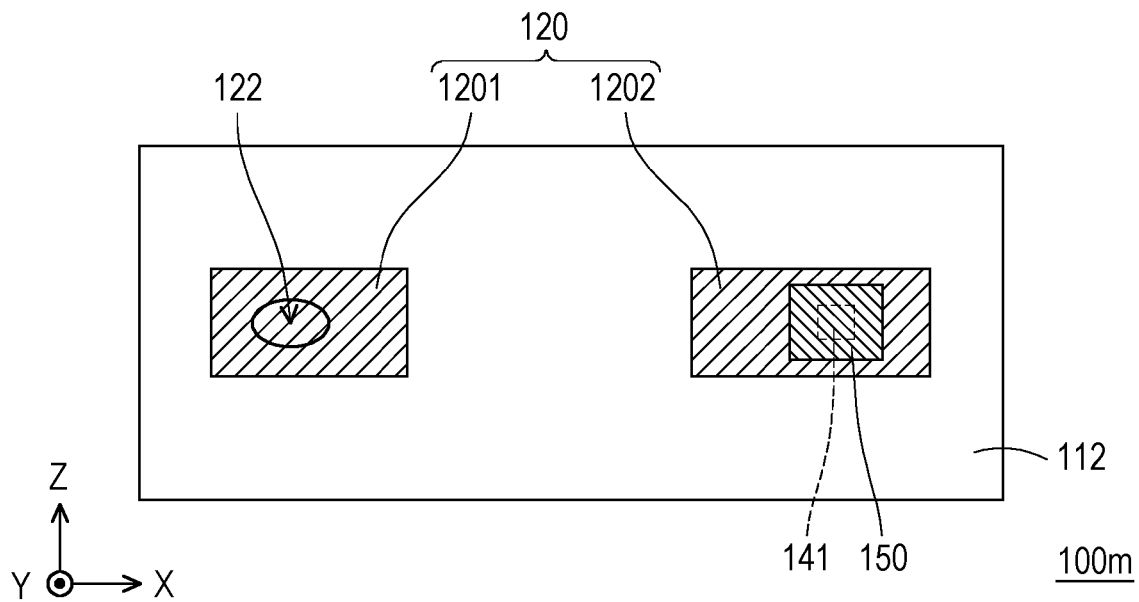

FIG. 11 to FIG. 13 are schematic top views of part of wafer structures according to various embodiments of the disclosure. Referring to FIG. 1C and FIG. 11 to FIG. 13 altogether, a wafer structure 100j, a wafer structure 100k, and a wafer structure 100m of the embodiment are similar to the wafer structure 100 in FIG. 1C, and the main differences are as follows.

In the schematic top views of the wafer structure 100j and the wafer structure 100k in the embodiment, the test pad 120 may have a first portion 1201 and a second portion 1202. The first portion 1201 extends parallel to the extending direction (i.e., the direction X) of the substrate 112, the second portion 1202 extends parallel to the direction of the direction Z, and the first portion 1201 and the second portion 1202 are connected to each other, but the disclosure is not limited thereto. In the embodiment, the probe marks 122 of the test pads 120 are located on the first portion 1201, both the first conductive holes 141 and the bond pads 150 are disposed on the second portion 1202, and the probe marks 122 and the first conductive holes 141 (or the bond pads 150) are disposed in a staggered manner.

In the schematic top view of the wafer structure 100m of the embodiment, the test pad 120 may have the first portion 1201 and the second portion 1202. The first portion 1201 extends parallel to the extending direction of the substrate 112 (i.e., the direction X), the second portion 1202 also extends parallel to the extending direction (i.e., the direction X) of the substrate 112, and the first portion 1201 and the second portion 1202 are physical separated from each other, but the disclosure is not limited thereto. In the embodiment, the first portion 1201 and the second portion 1202 can be electrically connected through other wires (not shown). In the embodiment, the probe marks 122 of the test pads 120 are located on the first portion 1201, both the first conductive holes 141 and the bond pads 150 are disposed on the second portion 1202, and the probe marks 122 and the first conductive holes 141 (or the bond pads 150) are disposed in a staggered manner.

In some embodiments, when the first portion 1201 extends parallel to the extending direction (i.e., the direction X) of the substrate 112, the second portion 1202 may also extend parallel to other directions (not shown) different from the direction X, as long as the extending direction of the first portion 1201 is different from the extending direction of the second portion 1202, the first portion 1201 and the second portion 1202 can be electrically connected (that is, the first portion 1201, the second portion 1202 can be connected to each other or physically separated from each other, and the probe marks 122 on the first portion 1201 and the first conductive holes 141 (or the bond pads 150) on the second portion 1202 can be disposed in a staggered manner.

In summary, in the wafer structure and the manufacturing method thereof according to an embodiment of the disclosure, with the configuration of additional multiple bond pads or filling structures, the bond pads with favorable flatness or test pads with favorable flatness are provided. Accordingly, the bond pads or the test pads with the filling structures can be used for hybrid bonding with another wafer structure, so as to ensure that when performing the wafer bonding, the wafer structure of the embodiment can have a favorable bonding quality, no air bubbles may be generated between the two corresponding bond pads after bonding, and there is a lower resistance value at the place where the wafers bond, thereby improving the electrical quality and electrical reliability of the wafer structure of the embodiment.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A wafer structure, comprising:
a substrate structure;
a first dielectric layer disposed on the substrate structure;
a plurality of test pads disposed in the first dielectric layer and exposed outside the first dielectric layer, wherein each of the test pads has a probe mark;
a second dielectric layer disposed on the first dielectric layer and having a top surface away from the test pads; and
a plurality of bond pads disposed in the second dielectric layer and exposed outside the second dielectric layer, wherein each of the bond pads is electrically connected to a corresponding test pad, the bond pads have bonding surfaces away from the test pads, and the bonding surfaces are flush with the top surface,
wherein in a normal direction of the substrate structure, each of the bond pads does not overlap with the corresponding probe mark of the test pad,
wherein the test pads are electrically connected to the substrate structure, and the test pads are not electrically connected to one another,
wherein the second dielectric layer is further disposed in the probe mark.

2. A wafer structure, comprising:
a substrate structure;
a first dielectric layer disposed on the substrate structure;
a plurality of test pads disposed in the first dielectric layer and exposed outside the first dielectric layer, wherein each of the test pads has a probe mark;
a second dielectric layer disposed on the first dielectric layer and having a top surface away from the test pads;
a plurality of bond pads disposed in the second dielectric layer and exposed outside the second dielectric layer, wherein each of the bond pads is electrically connected to a corresponding test pad, the bond pads have bonding surfaces away from the test pads, and the bonding surfaces are flush with the top surface;
a third dielectric layer disposed between the first dielectric layer and the second dielectric layer; and
a plurality of first conductive holes penetrating through the third dielectric layer and being electrically connected to each of the bond pads and the corresponding test pads, respectively,
wherein in a normal direction of the substrate structure, each of the bond pads does not overlap with the corresponding probe mark of the test pad,
wherein the test pads are electrically connected to the substrate structure, and the test pads are not electrically connected to one another,
wherein the third dielectric layer is further disposed in the probe mark.

3. A wafer structure, comprising:
a substrate structure;
a first dielectric layer disposed on the substrate structure;
a plurality of test pads disposed in the first dielectric layer and exposed outside the first dielectric layer, wherein each of the test pads has a probe mark;
a second dielectric layer disposed on the first dielectric layer and having a top surface away from the test pads;
a plurality of bond pads disposed in the second dielectric layer and exposed outside the second dielectric layer, wherein each of the bond pads is electrically connected to a corresponding test pad, the bond pads have bonding surfaces away from the test pads, and the bonding surfaces are flush with the top surface;
a third dielectric layer disposed between the first dielectric layer and the second dielectric layer;
a plurality of first conductive holes penetrating through the third dielectric layer and being electrically connected to each of the bond pads and the corresponding test pads, respectively; and
a redistribution layer disposed between the second dielectric layer and the third dielectric layer and comprising:
at least one circuit layer disposed on the third dielectric layer and comprising a plurality of first pads;
at least one fourth dielectric layer disposed on the circuit layer; and
a plurality of second conductive holes penetrating through the fourth dielectric layer and being electrically connected to the corresponding bond pads and the corresponding first pads, respectively,
wherein in a normal direction of the substrate structure, each of the bond pads does not overlap with the corresponding probe mark of the test pad,
wherein the test pads are electrically connected to the substrate structure, and the test pads are not electrically connected to one another,
wherein each of the first pads overlaps with the corresponding test pad in the normal direction.

4. The wafer structure of claim 3, wherein the at least one circuit layer further comprises:
a plurality of second pads physically separated from the first pads, wherein each of the second pads overlaps with the corresponding probe mark of the test pad in the normal direction.

5. The wafer structure of claim 3, wherein the at least one circuit layer further comprises:
a plurality of second pads physically separated from the first pads, wherein each of the second pads does not overlap with the corresponding probe mark of the test pad in the normal direction.

6. A manufacturing method of a wafer structure, comprising:
providing a substrate structure;

forming a plurality of test pads on the substrate structure, wherein each of the test pads has a probe mark;

forming a first dielectric layer on the substrate structure, so that the test pads are disposed in the first dielectric layer and exposed outside the first dielectric layer;

forming a plurality of bond pads on the first dielectric layer so that each of the bond pads is electrically connected to a corresponding test pad; and forming a second dielectric layer on the first dielectric layer, so that the bond pads are disposed in the second dielectric layer and exposed outside the second dielectric layer, wherein the second dielectric layer has a top surface away from the test pads, the bond pads have a bonding surface away from the test pads, and the bonding surface is flush with the top surface, wherein in a normal direction of the substrate structure, each of the bond pads does not overlap with the corresponding probe mark of the test pad, wherein the test pads are electrically connected to the substrate structure, and the test pads are not electrically connected to one another, wherein the second dielectric layer is further disposed in the probe mark.

* * * * *